United States Patent
Schweitzer, III et al.

(10) Patent No.: US 10,345,363 B2
(45) Date of Patent: Jul. 9, 2019

(54) HIGH-FIDELITY VOLTAGE MEASUREMENT USING RESISTIVE DIVIDER IN A CAPACITANCE-COUPLED VOLTAGE TRANSFORMER

(71) Applicant: Schweitzer Engineering Laboratories, Inc., Pullman, WA (US)

(72) Inventors: Edmund O. Schweitzer, III, Pullman, WA (US); Veselin Skendzic, Schwenksville, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/139,948

(22) Filed: Sep. 24, 2018

(65) Prior Publication Data
US 2019/0094287 A1    Mar. 28, 2019

Related U.S. Application Data

(60) Provisional application No. 62/562,269, filed on Sep. 22, 2017.

(51) Int. Cl.
    *G01R 31/08*    (2006.01)
    *H01F 38/24*    (2006.01)
    (Continued)

(52) U.S. Cl.
    CPC .......... *G01R 31/086* (2013.01); *G01R 1/203* (2013.01); *G01R 15/06* (2013.01); *G01R 15/16* (2013.01);
    (Continued)

(58) Field of Classification Search
    CPC .. G01R 31/086; G01R 31/083; G01R 31/085; G01R 31/02; G01R 31/2836;
    (Continued)

(56) References Cited

U.S. PATENT DOCUMENTS

| 2,209,810 A | 7/1940 | Cordroy |
| 3,401,304 A | 9/1968 | Woodworth |

(Continued)

FOREIGN PATENT DOCUMENTS

| CN | 104730419 | 6/2015 |
| CN | 103364604 | 6/2016 |

(Continued)

OTHER PUBLICATIONS

PCT/US2018/052470 Patent Cooperation Treaty, International Search Report and Written Opinion of the International Searching Authority, dated Nov. 30, 2018.

(Continued)

*Primary Examiner* — Thang X Le
(74) *Attorney, Agent, or Firm* — Jared L. Cherry; Richard M. Edge

(57) ABSTRACT

The present disclosure pertains to systems and methods for detecting traveling waves in electric power delivery systems. In one embodiment, a system comprises a capacitance-coupled voltage transformer (CCVT) in an electric power delivery system, the CCVT comprising a first capacitor disposed between an electrical bus and a first electrical node, and a second capacitor electrically disposed between the first electrical node and a ground connection. A resistive divider in electrical communication with a first node may generate a resistive divider electrical signal corresponding to a voltage value. An intelligent electronic device (IED) in electrical communication with the resistive divider monitors a resistive divider voltage signal. The IED detects a traveling wave based on the resistive divider voltage signal and a measurement of a primary current through an electrical bus in electrical communication with the CCVT; and analyzes the traveling wave to detect a fault on the electric power delivery system.

20 Claims, 9 Drawing Sheets

(51) Int. Cl.
*H01F 38/32* (2006.01)
*G01R 15/06* (2006.01)
*G01R 31/02* (2006.01)
*G01R 1/20* (2006.01)
*G01R 15/16* (2006.01)

(52) U.S. Cl.
CPC ......... *G01R 31/024* (2013.01); *G01R 31/083* (2013.01); *G01R 31/085* (2013.01); *H01F 38/24* (2013.01); *H01F 38/32* (2013.01)

(58) Field of Classification Search
CPC ...... G01R 31/08; G01R 31/088; G01R 1/203; G01R 15/06; G01R 15/16; G01R 15/14; G01R 15/142; H02H 7/04; H02H 7/05; H02H 9/007
See application file for complete search history.

(56) References Cited

U.S. PATENT DOCUMENTS

| | | | |
|---|---|---|---|
| 3,546,534 A | 12/1970 | Kotos | |
| 3,558,984 A | 1/1971 | Smith | |
| 3,684,948 A | 8/1972 | Eissmann | |
| 3,870,926 A * | 3/1975 | Hughes | G01R 15/06 324/126 |
| 4,322,768 A | 3/1982 | Maeda | |
| 4,327,390 A | 4/1982 | Despiney | |
| 4,329,638 A * | 5/1982 | Le Maguet | H02H 7/05 323/233 |
| 4,757,263 A | 7/1988 | Cummings | |
| 4,914,382 A | 4/1990 | Douville | |
| 5,272,439 A | 12/1993 | Mashikian | |
| 5,367,426 A | 11/1994 | Schweitzer, III | |
| 5,418,776 A | 5/1995 | Purkey | |
| 5,430,599 A | 7/1995 | Charpentier | |
| 5,473,244 A | 12/1995 | Libove | |
| 5,563,459 A | 10/1996 | Kurosawa et al. | |
| 5,627,415 A | 5/1997 | Charpentier | |
| 5,671,112 A | 9/1997 | Hu | |
| 5,703,745 A | 12/1997 | Roberts | |
| 5,805,395 A | 9/1998 | Hu | |
| 5,991,177 A | 11/1999 | Kaczkowski | |
| 6,028,754 A | 2/2000 | Guzman | |
| 6,256,592 B1 | 7/2001 | Roberts | |
| 6,341,055 B1 | 1/2002 | Guzman-Casillas | |
| 6,356,421 B1 | 3/2002 | Guzman-Casillas | |
| 6,392,390 B1 | 5/2002 | Ito et al. | |
| 6,456,947 B1 | 9/2002 | Adamiak | |
| 6,493,203 B1 | 12/2002 | Ito et al. | |
| 6,518,767 B1 | 2/2003 | Roberts | |
| 6,571,182 B2 | 5/2003 | Adamiak | |
| 6,590,397 B2 | 7/2003 | Roberts | |
| 6,798,211 B1 | 9/2004 | Rockwell | |
| 6,879,917 B2 | 4/2005 | Turner | |
| 6,919,717 B2 | 7/2005 | Ghassemi | |
| 7,095,139 B2 | 8/2006 | Tsutada et al. | |
| 7,345,863 B2 | 3/2008 | Fischer | |
| 7,425,778 B2 | 9/2008 | Labuschagne | |
| 7,469,190 B2 | 12/2008 | Bickel | |
| 7,472,026 B2 | 12/2008 | Premerlani | |
| 7,629,786 B2 | 12/2009 | Lee | |
| 7,696,648 B2 | 4/2010 | Kinoshita et al. | |
| 7,812,615 B2 | 10/2010 | Gajic | |
| 7,982,341 B2 | 7/2011 | Kinoshita et al. | |
| 8,008,810 B2 | 8/2011 | Kinoshita et al. | |
| 8,217,536 B2 | 7/2012 | Koshizuka et al. | |
| 8,289,668 B2 | 10/2012 | Kasztenny | |
| 8,553,379 B2 | 10/2013 | Kasztenny | |
| 8,564,159 B2 | 10/2013 | Udagawa et al. | |
| 8,750,008 B2 | 6/2014 | Sugiyama et al. | |
| 9,008,982 B2 * | 4/2015 | Tziouvaras | G01R 31/027 307/113 |
| 9,459,291 B2 * | 10/2016 | Matsumoto | G01R 19/0007 |
| 9,714,957 B2 * | 7/2017 | Giovanelli | G01R 15/06 |
| 2001/0012984 A1 | 8/2001 | Adamiak | |
| 2002/0101229 A1 | 8/2002 | Roberts | |
| 2003/0164714 A1 * | 9/2003 | Ghassemi | G01R 15/06 324/658 |
| 2005/0068792 A1 | 3/2005 | Yasumura | |
| 2006/0012374 A1 | 1/2006 | Kojovic | |
| 2007/0070565 A1 | 3/2007 | Benmouyal | |
| 2007/0290670 A1 | 12/2007 | Lee | |
| 2008/0077336 A1 | 3/2008 | Fernandes | |
| 2008/0243413 A1 * | 10/2008 | Kasztenny | H03H 17/04 702/85 |
| 2009/0059447 A1 | 3/2009 | Gajic | |
| 2009/0091867 A1 | 4/2009 | Guzman-Casillas | |
| 2009/0097173 A1 | 4/2009 | Kinoshita et al. | |
| 2010/0002348 A1 | 1/2010 | Donolo | |
| 2010/0039737 A1 | 2/2010 | Koshizuka et al. | |
| 2010/0085668 A1 | 4/2010 | Kinoshita et al. | |
| 2010/0141235 A1 | 6/2010 | Koshiduka et al. | |
| 2010/0217548 A1 | 8/2010 | Faybisovich | |
| 2011/0080053 A1 | 4/2011 | Urano | |
| 2013/0155553 A1 | 6/2013 | Kawasaki et al. | |
| 2013/0176021 A1 | 7/2013 | Udagawa et al. | |
| 2015/0081234 A1 | 3/2015 | Schweitzer, III et al. | |
| 2016/0077149 A1 | 3/2016 | Schweitzer, III | |
| 2016/0241336 A1 | 8/2016 | Kasztenny | |
| 2017/0082675 A1 | 3/2017 | Schweitzer, III et al. | |
| 2017/0110875 A1 | 4/2017 | Schweitzer, III et al. | |
| 2017/0131340 A1 * | 5/2017 | Tallam | G01R 31/025 |

FOREIGN PATENT DOCUMENTS

| | | |
|---|---|---|
| CN | 103604991 | 3/2017 |
| EP | 1074849 | 2/2001 |
| WO | 2009081215 | 7/2009 |
| WO | 2017125145 | 7/2017 |

OTHER PUBLICATIONS

PCT/US2018/052480 Patent Cooperation Treaty, International Search Report and Written Opinion of the International Searching Authority, dated Nov. 26, 2018.

J. Brunke, Elimination of Transient Inrush Currents When Energizing Unloaded Power Transformers, Ph.D dissertation, ETH Swiss Federal Institute of Technology, Zurich, Switzerland, 1998.

D. Goldsworthy, T. Roseburg, D. Tziouvaras, and J. Pope, Controlled Switching of HVAC Circuit Breakers: Application Examples and Benefits, 34th Annual Western Protective Relay Conference Proceedings, Spokane, WA, Oct. 2007.

J. H. Brunke and K. J. Frohlich, Elimination of Transformer Inrush Currents by Controlled Switching, Part II, IEEE Transactions on Power Delivery, vol. 16, No. 2, pp. 281-285, Apr. 2002.

J. H. Brunke and K. J. Frohlich, Elimination of Transformer Inrush Currents by Controlled Switching, IEEE Electric Power Systems Research-Selected Topics in Power System Transients, pp. 642-649, May 2006.

A. Mercier, E. Portales, Y. Filion, and A. Salibi, Transformer Control Switching Taking into Account the Core Residual Flux—a Real Case Study, Paper No. 13-201, Cigre 2002 Session, Paris, France.

E. Portales, and Q. Bui-Van, New Control Strategy of Inrush Transient During Transformer Energization at Toulnustouc Hydropower Plant Using a Double-Break 330 kV Circuit Breaker, IPST 2003, New Orleans, USA.

CIGRE WG 13.07, Controlled Switching of Unloaded Power Transformers, ELECTRA, No. 212, pp. 39-47, Feb. 2004.

M. Steurer and K. Frohlich, The impact of inrush currents on the mechanical stress of high voltage power transformer coils, IEEE Transactions on Power Delivery, vol. 17, No. 1, pp. 155-160, Jan. 2002.

F. Ghassemi and P. Gale, Harmonic voltage measurements using CVTs, IEEE Transactions on Power Delivery, vol. 17, No. 4, pp. 915-920, Oct. 2002.

F. Ghassemi and P. Gale, Method to measure CVT transfer function, IEEE Transactions on Power Delivery, vol. 20, No. 1, pp. 443-449, Jan. 2005.

(56) References Cited

OTHER PUBLICATIONS

S. Zhao, H. Y. Li, F. Ghassemi, P. Crossley, Impact of power quality sensor technique on power system protection voltage transient measurements, 10th IET International Conference on Developments in Power System Protection, Mar. 2010.
R. Malewski, J. Douville, and L. Lavalee, Measurement of switching transients in 735 kV substations and assessment of their severity for transformer insulation, IEEE Transactions on Power Delivery, vol. 3, No. 4, pp. 1380-1390, Oct. 1988.
Douglas I. Taylor, Single Phase Transformer Inrush Current Reduction Using Pre-Fluxing, A Thesis Presented in Partial Fulfillment of the Requirement for the Degree of Master of Science with a Major in Electrical Engineering in the College of Graduate Studies, University of Idaho, Nov. 13, 2009.
M. J. Heathcote, The J & P Transformer Book, 12th Edition, Elsevier, 1998, pp. 512-513.
S. G. Abdulsalam, W. Xu, A Sequential Phase Energization Method for Transformer Inrush Current Reduction-Transient Performance and Practical Considerations, IEEE Transactions of Power Delivery, vol. 22, No. 1, Jan. 2007, pp. 208-216.
A. Ebner, Determination of Residual Flux for Controlled Transformer Energisation, Power Systems and High Voltage Laboratories Annual Report, 2008, Swiss Federal Institute of Technology, Zurich, Switzerland, pp. 57-61.
V. Molcrette, J.-L. Kotny, J.-P. Swan, J.-F. Brundy, Reduction of Inrush Current in Single-Phase Transformer using Virtual Air Gap Technique, IEEE Transactions on Magnetics, vol. 34, No. 4, pp. 1192-1194, Jul. 1998.
B. Kovan, F. De Leon, D. Czarkowski, Z. Zabar, L. Birenbaum, Mitigation of Inrush Currents in Network Transformers by Reducing the Residual Flux With an Ultra-Low-Frequency Power Source, IEEE Transactions on Power Delivery, vol. 26, No. 3, pp. 1563-1570, Jul. 2011.
ABB, Bushing Potential Device, Type PBA2, Instructions for Installation and Maintenance, Sep. 2003.
T. Liu, H. Siguerdidjane, M. Petit, T. Jung, J.P. Dupraz, Reconstitution of Power transformer's Residual Flux with CVT's Measurement During its De-energization, Sep. 8-10, 2010.
Three Phase Electric Power, available at http://en.wikipedia.org/wiki/three-phase_electric_power on Mar. 2, 2011.
Capacitor Voltage Transformer, available at httP://en.wikipedia.org/wiki/Capacitor_voltage_transformer on Sep. 4, 2010.
Demetrios A. Tziouvaras, Jeff Roberts, and Gabriel Benmouyal, New Multi-Ended Fault Location Design for Two- or Three-Terminal Lines, Nov. 1, 2004.
Gabriel Benmouyal, The Trajectories of Line Current Differential Faults in the Alpha Plane, Sep. 22, 2005.
Debra Carroll, John Dorfner, Tony Lee, Ken Fodero, and Chris Huntly, Resolving Digital Line Current Differential Relay Security and Dependability Problems: A Case History, 29th Annual Western Protective Relay Conference, Spokane Washington, Oct. 22-24, 2002.
Gabriel Benmouyal and Joe B. Mooney, Advanced Sequence Elements for Line Current Differential Protection, Sep. 15, 2006.
GE Industrial Systems, L90 Line Current Differential System, UR Series Instruction Manual, Section 8, Manual P/N:1601-0081-T1(GEK-113488) L90 Revision 5.6x2008, Section 8, Jan. 2008.
PCT/US2010/049162 Patent Cooperation Treaty International Search Report and Written Opinion of the International Searching Authority, dated Dec. 30, 2010.
Bogdan Kasztenny, Ilia Voloh, Eric A. Udren, Rebirth of Phase Comparison Line Protection Principle, 60th Annual Georgia Tech Protective Relaying Conference, Atlanta, Georgia, May 3-5, 2006.
Min Zhang, Xinzhou Dong, Z Q Bo, B R J Caunce, and A Klimek, Simulation Tests of a Novel Criterion for Neutral Current Differential Protection, International Conference on Power System Technology, Sep. 2006 Jeff Roberts, Demetrios Tziouvaras, Gabriel Benmouyal, and Hector J. Altuve, The Effect of Multiprinciple Line Protection on Dependability and Security, Feb. 22, 2001.
Jeff Roberts, Demetrios Tziouvaras, Gabriel Benmouyal, and Hector J. Altuve, The Effect of Multiprinciple Line Protection on Dependability and Security, Feb. 22, 2001.
PCT/US2010/049166 Patent Cooperation Treaty International Search Report and Written Opinion of the International Searching Authority, dated Dec. 13, 2010.
U.S. Appl. No. 13/416,978, Non-Final Office Action, dated May 8, 2014.
F. Ghassemi and P. Gale, "Method to Measure CVT Transfer Function", IEEE Transactions on Power Delivery, vol. 17, No. 4, pp. 915-920, Oct. 2002.
PCT/US2018/052275 Patent Cooperation Treaty International Search Report and Written Opinion of the International Searching Authority, dated Dec. 7, 2018.
ABB High Voltage Products. "PQ-Sensor™" http://www.pqs-consulting.com/brochure-abb-1hsm_9543_42-20en_pqsensor_technical_information.pdf, Apr. 2008.
TRENCH, "Master of Waves" https://w5.siemens.com/italy/web/pw/press/newsletterenergy/Documents/Trench_Italia.pdf, Sep. 2014.
RITZ Instrument Transformers. "PQSensor Power Quality Sensor", Apr. 2006.
BVM Systems Limited, "PQSensor™ MkIII Installation and Commissioning Manual", Aug. 2010.
ARTECHE "Power Quality Measurement with Capacitor Voltage Transformers", Nov. 2013.
BVM Systems Limited, "Harmonic Measurements on Transmission Networks" Sep. 2010.
50HZ Solutions, Corporate Profile, Sep. 2014.
Kai Che, Jinxi Yang, Tanru Ni, Xiangjun Zeng, Yang Leng, Yunkun Xiang, "Testing System of Voltage Traveling Wave Fault Location Technique" 2017 IEEE Conference on Energy Internet and Energy System Integration, Nov. 26-28, 2017.
Zewen Li, Tuofu Deng, Xiangjun Zeng, Feng Deng, Lei Shu, "Theoretical Modeling and Implementation of Traveling Wave Sensor Based on PCB Coils" Journal of Sensors, vol. 2015, Apr. 2, 2015.
T. Yamada, E. Kurosaki, N. Yamamoto, M. Matsumoto, "Development of Simple Coupling-Capacitor Voltage Transformer for GIS" 2001 IEEE Power Engineering Society Winter Meeting, Jan. 28-Feb. 1, 2001.
E. O. Schweitzer, III, B. Kasztenny, "Distance Protection, Why Have we Started with a Circle, Does it Matter, and What Else is Out There?" 44th Annual Western Protective Relay Conference, Oct. 2017.
David Costello, Karl Zimmerman, "CVT Transients Revisited—Distance, Directional Overcurrent, and Communications-Assisted Tripping Concerns" 65th Annual Conference for Protective Relay Engineers, Apr. 2012.
R. A. Hedding "CCVT Transient Fundamentals" 65th Annual Conference for Protective Relay Engineers, 2012.
Y.J. Xia "A Novel Fault Location Scheme Using Voltage Traveling Wave of CVTs" Universities Power Engineering Conference, 2004.
R. G. Bainy, F. V. Lopes, W. L. A. Neves, "Benefits of CCVT Secondary Voltage Compensation on Traveling Wave-Based Fault Locators" PES General Meeting 2014.
F. Ghassemi "Harmonic Voltage Measurements Using CVTs" IEEE Transactions on Power Delivery, vol. 20, No. 1, Jan. 2005.
H. J. Vermeulen, P. Davel, "Voltage Harmonic Distortion Measurements Using Capacitive Votlage Transformers" IEEE Africon, 1996.
BVM Systems Limited. "PQSensor™ Broadband Voltage Transducer", http://www.bvmsystems.com.uk/Downloads_files/PQSensor_1.0_A4.pdf, Dec. 2009.

* cited by examiner

HIGH-FIDELITY VOLTAGE MEASUREMENT USING RESISTIVE DIVIDER IN A CAPACITANCE-COUPLED VOLTAGE TRANSFORMER

RELATED APPLICATION

The present application claims priority under 35 U.S.C. § 119 to U.S. Provisional Patent Application No. 62/562,269, titled HIGH-FIDELITY VOLTAGE MEASUREMENT USING CURRENT TRANSFORMERS IN A CAPACITANCE COUPLED VOLTAGE TRANSFORMER filed Sep. 22, 2017, which is incorporated by reference.

TECHNICAL FIELD

This disclosure relates to obtaining high-fidelity voltage measurements in an electric power delivery system using in a capacitance-coupled voltage transformer (CCVT).

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
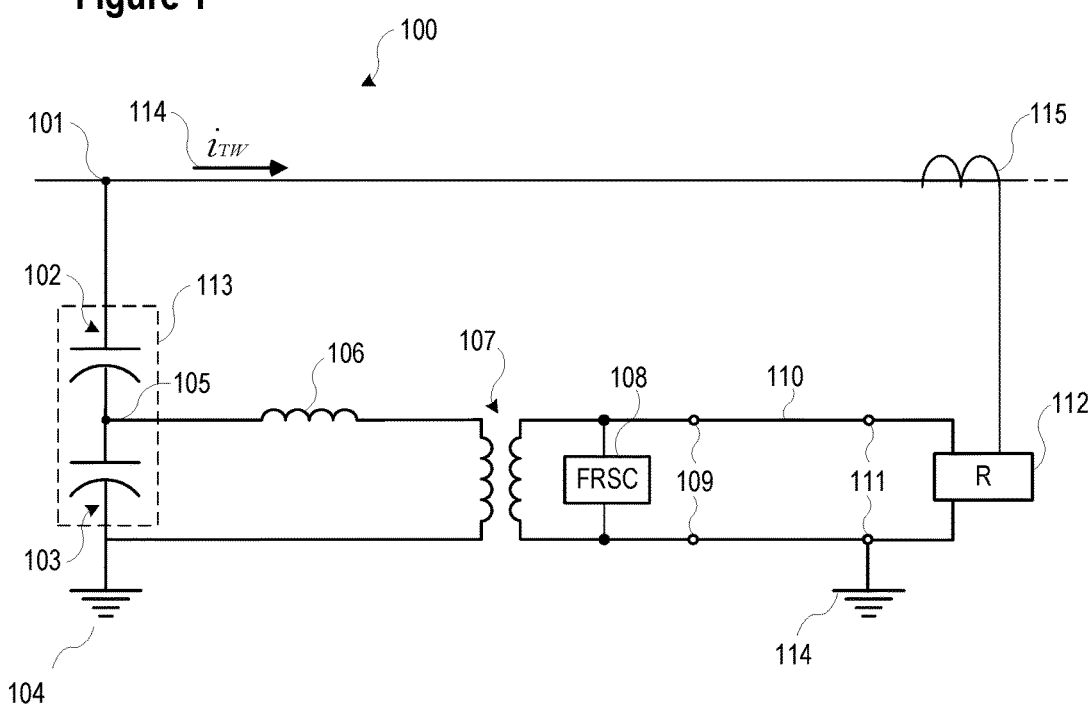
FIG. 1 illustrates a simplified diagram of a system including a CCVT consistent with the present disclosure.

Traveling waves are surges of electricity resulting from sudden changes in voltage, such as short circuits, that propagate along power lines at very high velocities. The propagation velocity is close to the speed of light in free space for overhead lines and about half the speed of light in free space for underground cable lines. Traveling waves originating at the location of a short circuit on a transmission line arrive at the line terminals in as little as 1-2 milliseconds following the fault, depending on the fault location and line type. Relative timing, polarity and magnitudes of traveling waves allow precise fault locating and enable several line protection techniques. Because traveling waves are available at the line terminal very quickly following a line short circuit, they allow ultra-high-speed protection and associated benefits.

A traveling wave has current and voltage components. As the traveling wave propagates, at any point along the line a sudden change in voltage can be observed ("a voltage traveling wave") as well as a sudden change in current ("a current traveling wave"). The voltage and current traveling waves on the line, away from the line ends, are related by the line characteristic impedance, as expressed in Eq. 1.

$$\text{Voltage Traveling Wave} = \text{Current Traveling Wave} * \text{Characteristic Impedance} \qquad \text{Eq. 1}$$

When a traveling wave arrives at a discontinuity in the characteristic impedance, such as a busbar connecting multiple lines and other power system elements, part of the wave reflects back in the direction of arrival, and part of the wave continues in the original direction. These waves are separately referred to as an incident wave (the wave that arrived at the discontinuity), a reflected wave (the wave that reflected back), and a transmitted wave (the wave that continued in the original direction).

Current traveling waves may be measured by current transformers, which may be installed at the ends of transmission lines in substations. Current transformers typically have enough fidelity to measure current traveling waves with adequate accuracy for practical protection and fault locating applications. However, a current transformer measures the current at the point of its installation at the line terminal which is always a discontinuity in the characteristic impedance, and therefore it measures the sum of the incident and reflected current traveling waves. It does not measure the incident wave separately and it does not allow separating of the waves into incident, reflected, and transmitted waves.

Voltage transformers presently used in electric power systems may lack sufficient fidelity to measure voltage traveling waves with adequate accuracy. Accordingly, various embodiments disclosed herein may comprise a restive divider, combination of the resistive divided and the current transformer, and a variety of techniques to determine a voltage signal based on measurements obtained from them.

Because the voltage and current traveling waves are linked with the characteristic impedance of the line, it is possible to separate any given traveling wave into the incident, reflected and transmitted components. This separation is performed using the well-known equations [reference the "Locating Faults by the traveling waves they launch" paper]:

$$v_{incident} = \frac{V_{TV} - i_{TV}Z_c}{2} \qquad \text{Eq. 2}$$

$$v_{reflected} = \frac{V_{TW} + i_{TV}Z_c}{2}$$

or $$i_{incident} = \frac{V_{TW}/Z_c - i_{TW}}{2}$$

$$i_{reflected} = \frac{V_{TW}/Z_c + i_{TW}}{2}$$

However, to perform the wave separation systems and methods consistent with the present disclosure aims to accurately measure both the total current traveling wave ($i_{TW}$) and the voltage traveling wave ($V_{TW}$) at a given termination point on the line. Conventional current transformers may provide sufficiently accurate current traveling wave measurements, but conventional voltage transformers may not provide enough fidelity to measure voltage traveling waves.

Wave separation into the incident, reflected, and transmitted traveling waves may allow better utilization of the traveling wave information as compared with using just traveling wave measurements from current transformers, which are the sums of the incident and reflected waves. The following are examples of advanced applications when the incident, reflected, and transmitted traveling waves are individually available (separated).

Single-ended traveling wave fault locating methods may be improved because such systems may be able to identify direction of each received wave. This may allow a system to differentiate waves from a short circuit or from discontinuities on the line in the forward direction from waves arriving from behind the fault locating terminal.

Single- and multi-ended traveling wave fault locating methods may be improved by improving such systems' abilities to accommodate different types of line terminations. For example, when the terminating impedance is infinity (e.g., an open breaker or an inductor behind the terminal) the current measurement is zero and the incident and reflected current waves cancel. However, when looking at the separated incident wave and reflected waves, the fault locator has a reliable non-zero signal to analyze.

Traveling wave differential protection methods may be improved by separating traveling waves by having higher and more reliable traveling wave operating signals. This is particularly true for lines terminated with a high characteristic impedance, because such lines may be yielding a low or zero current wave measurement. Additionally, these schemes are more secure when working with incident waves by verifying the direction of each arriving traveling wave in a manner similar to the single-ended fault locators. Traveling wave distance elements may also be improved by using separated waves.

In various embodiments consistent with the present disclosure, high-fidelity voltage measurements may be subsequently filtered using a differentiator-smoother technique or other techniques appropriate for extracting traveling waves. Further, in various embodiments current and voltage traveling waves may be separated into incident, reflected, and transmitted waves. Specifically, the present disclosure is concerned with using a capacitance-coupled voltage transformer (CCVT) for obtaining high-fidelity voltage signals. The standard output voltage of a CCVT has a limited bandwidth and it does not provide high-fidelity voltage output.

In another aspect of this disclosure, the high-fidelity line voltage signal may improve the security and the operating time of distance (impedance) elements. During short-circuits the CCVT secondary voltage contains low-frequency components that may be as high as 40% of the nominal voltage and may last one to several power system cycles. During some fault conditions, the true secondary voltage may be a small percentage of the nominal voltage for high source-to-impedance ratio conditions. The large low-frequency transient components generated by the CCVTs may prevent impedance relays from measuring the true voltage with sufficient accuracy. As a result, these relays may lose security and/or operate slowly for in-zone faults. Supplying these impedance relays with voltage that is free from the CCVT-induced transients considerably improves security and speed of impedance protection.

In yet another aspect of this disclosure, the systems and methods disclosed herein may be utilized to monitor CCVT systems for failures. A CCVT can explode if capacitor elements fail and arcing occurs. Such an explosion can create hazardous projectiles and throw off hot oil, both of which pose a significant hazard to persons and property in proximity. The CCVT projectiles can cause damage to other elements in the substation, starting an avalanche of failures which may put human life in danger. The hazards associated with a CCVT can increase as the CCVT ages and capacitive elements become more likely to fail, especially if the CCVT operating ambient temperatures are high. By comparing the standard CCVT output voltage and the high-fidelity voltage, the systems and methods disclosed herein may detect CCVT failures and implement protective action to avoid explosions.

The systems and methods disclosed herein may be added to existing electric power systems, in addition to being included in newly installed systems. In certain embodiments, the systems and methods disclosed herein may be added to existing systems to provide high-fidelity voltage measurements.

FIG. 1 illustrates a simplified diagram of a system 100 including a CCVT consistent with the present disclosure. A capacitor stack 113 is in electrical communication with a high voltage portion 102 and a low voltage portion 103 and is connected between a primary voltage terminal 101 and a substation ground 104. A traveling wave 114, $i_{TW}$, may propagate through voltage terminal 101. A primary current measurement device 115 may detect the traveling wave 114 as it passes, and may detect information about the traveling wave that may be used in connection with various embodiments disclosed herein.

The capacitor stack 113 creates a capacitive voltage divider and produces an intermediate voltage at the tap terminal 105. In various embodiments, the primary voltage may be 110 kV and above, and may include 750 kV and 1 MV networks. The intermediate voltage may be in the range of 5-30 kV. A step-down transformer 107 further steps down the intermediate voltage to a standard secondary voltage at the output CCVT terminals 109. The standard secondary voltage may be in the range of 60-250 V in various embodiments.

A direct connection of a step-down transformer to a capacitor stack may introduce an angle measurement error. To reduce that error, a tuning reactor 106 is connected in series between the intermediate voltage terminal in the capacitive divider 105 and the step-down transformer 107. A connection of the step-down transformer 107 and the capacitors 102 and 103 would create a danger of ferroresonance. A ferroresonance is a self-exciting and potentially destructive oscillation between the non-linear magnetizing branch of the step-down transformer 107 and the capacitors 102 and 103. To prevent ferroresonance, a ferroresonance suppression circuit (FRSC) 108 is connected to the secondary winding of the step-down transformer 107. The output voltage at the CCVT secondary terminals 109 is connected via control cables 110 to the input terminals 111 of the end device 112 such as a protective relay, R. The connection at the end device 112 typically includes a safety ground 114.

System 100 acts inadvertently as a band-pass filter. System 100 passes the fundamental frequency component (typically 50 or 60 Hz) with the nominal transformation ratio and small magnitude and angle errors. The components of system 100 considerably attenuate frequencies below the nominal power system frequency as well as high frequencies. In addition, the CCVT produces transient components in the spectrum close to the nominal frequency that may impair the operation of the impedance protection as mentioned above.

For very high frequency components, such as voltage traveling waves, an ideal tuning reactor 106 behaves as an open circuit, and therefore it does not pass any very high frequency signals to the step-down transformer 107. Similarly, an ideal step-down transformer 107 is an open circuit for very high frequencies, and as such, it also prevents any high-frequency signals from being passed to the low voltage side 109 of the step-down transformer 107. As a result, the end-device 112 does not receive high-frequency signals associated with traveling wave 114 at its terminals 111. In practice, however, the tuning reactor 106 has some parasitic inter-turn capacitance, which may also be called stray capacity. Similarly, the windings of the step-down transformer 107 also include parasitic capacitance.

Various embodiments consistent with the present disclosure may utilize measurements from primary current measurement device 115 along with additional measurements associated with capacitor stack 113. Such systems and methods may, use such information to separate traveling wave signals into incident traveling waves and reflected traveling waves using Eq. 2, and providing distance protection. Voltage and current measurements may also be used to provide impedance based protection. Further, such systems and methods may provide improved impedance protection by reducing or eliminating CCVT transients near the fundamental power system frequency or to detect the CCVT internal component failure.

Figure 2:
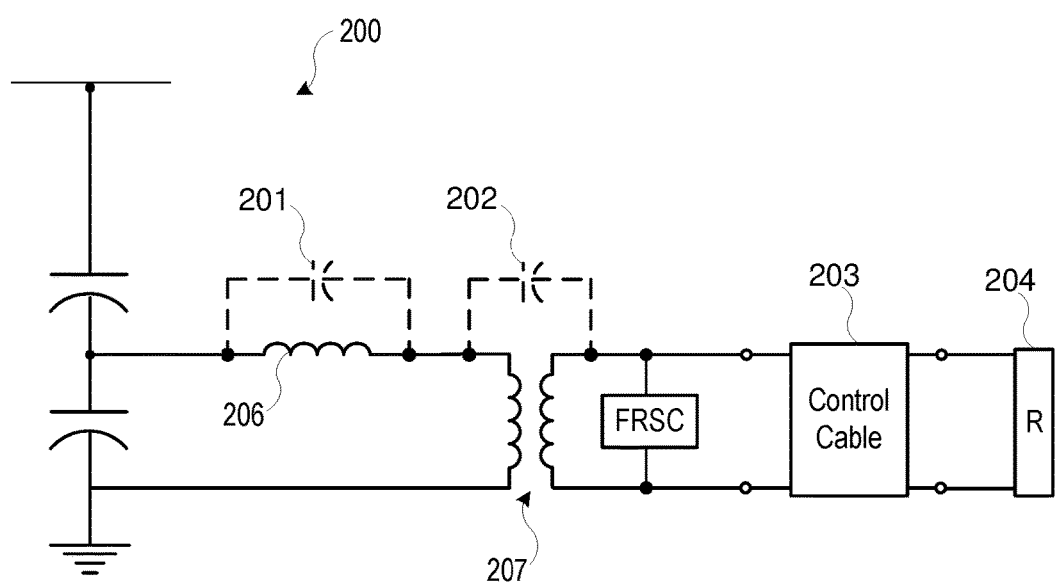
FIG. 2 shows a simplified circuit diagram of a CCVT system including parasitic capacitances, which are illustrated in dashed lines, and are associated with a tuning reactor and step-down transformer, consistent with embodiments of the present disclosure.

FIG. 2 shows a simplified circuit diagram of a CCVT system 200 including parasitic capacitances, which are illustrated in dashed lines, and are associated with a tuning reactor 206 and step-down transformer 207, consistent with embodiments of the present disclosure. Capacitance 201 results from the turn-to-turn capacitance of the coil that makes up the tuning reactor 206. Capacitance 202 results from the turn-to-turn and inter-winding capacitances of the step-down transformer 207

Capacitance in system 200 creates a path for the high-frequency signal components to pass through system 200. Capacitance 201 provides a path through the tuning reactor 206 for high frequency signals. Capacitance 202 creates a path for the high-frequency signal components to pass to the low voltage side of the step-down transformer.

The control cable 203 has a complex frequency response, but it allows high-frequency components—although the signal may include artifacts and distortions—to reach the end-device 204, R. However, the stray capacitances 201, 202 do not result in delivering a faithful replica of the high-frequency component in the primary voltage to the end device 204. The end device 204 may see the correct polarity of the very first wave, and a ringing afterwards. This is enough to allow application of a traveling wave protection element, but such a signal may not allow measuring individual voltage traveling waves with high fidelity.

Figure 3:
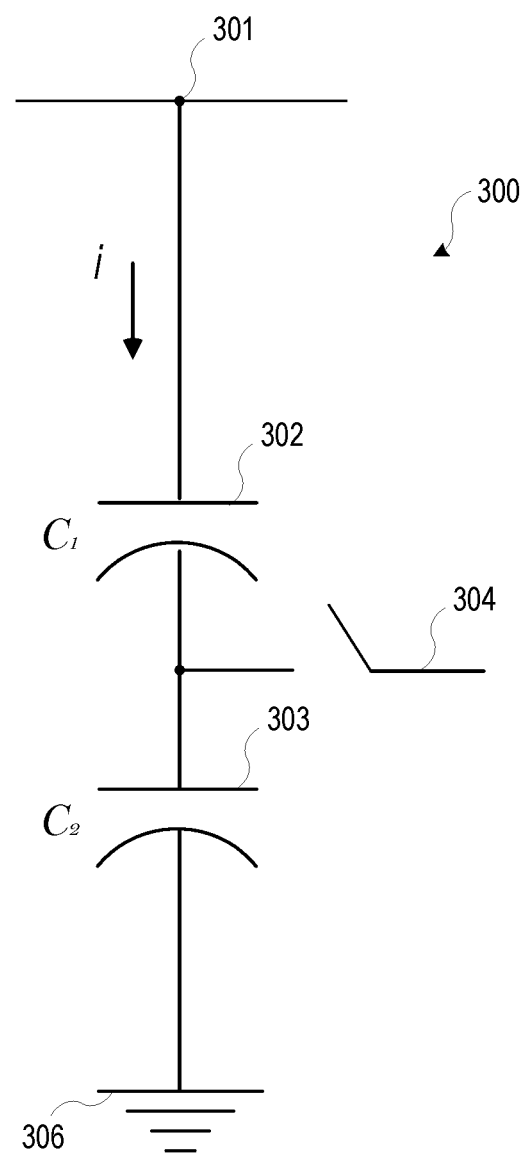
FIG. 3 illustrates a simplified diagram of a CCVT system at high frequencies consistent with embodiments of the present disclosure.

FIG. 3 illustrates a simplified diagram of a CCVT system 300 at high frequencies consistent with embodiments of the present disclosure. In the first approximation, the tuning reactor, which is not shown but which, can be considered as an open circuit, in spite of its stray capacitance. The circuit toward the tuning reactor is represented by an open switch 304.

A current flowing through an ideal capacitor is proportional to the derivative (d/dt) of the voltage across the capacitor. The primary voltage 301 (v), the CCVT capacitors 302 and 303, and the current (i) flowing through the capacitors 302 and 303 is shown by Eq. 3:

$$i = (C_1 + C_2)\frac{dv}{dt} \qquad \text{Eq. 3}$$

Figure 4A:
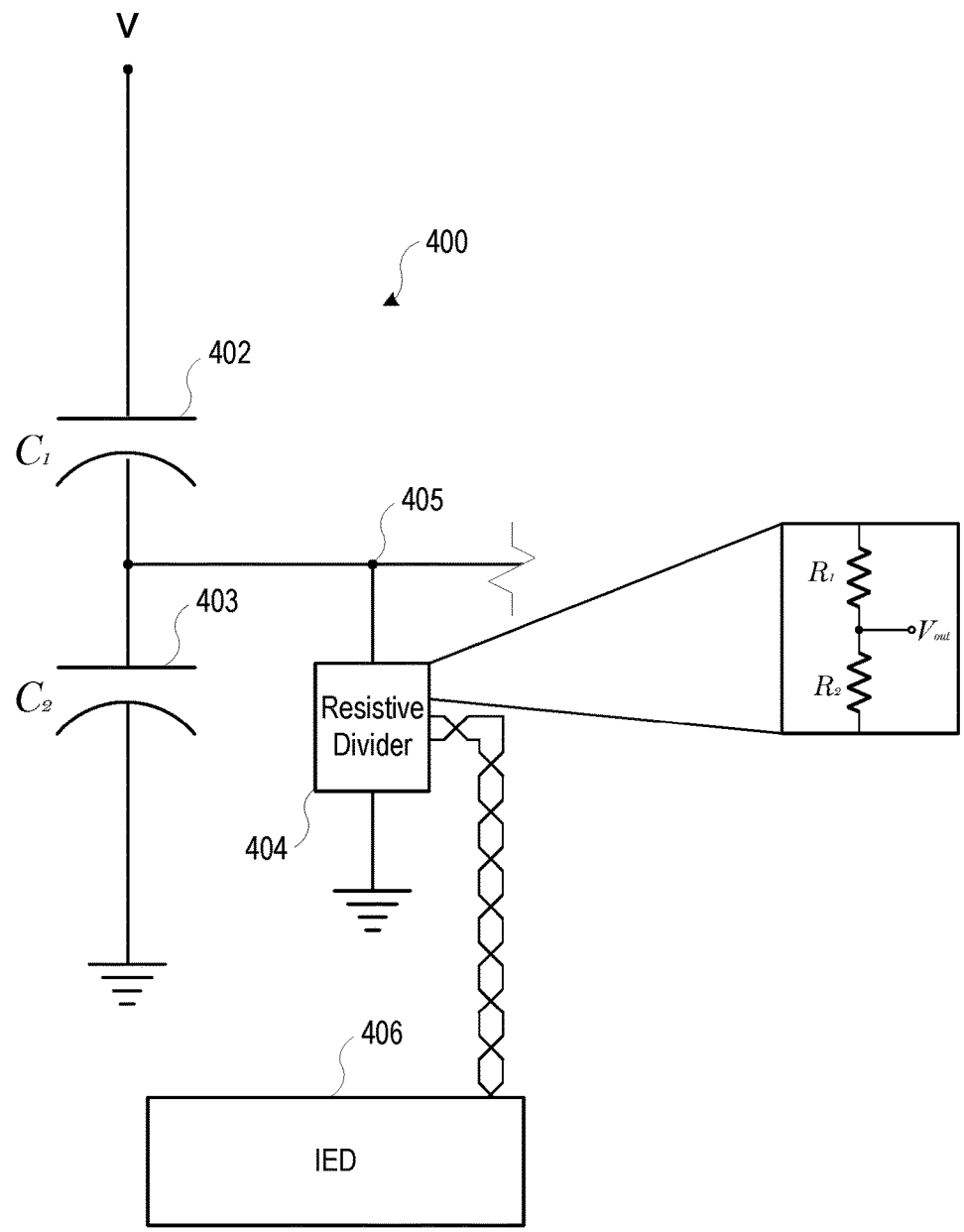
FIG. 4A illustrates a simplified diagram of a system to determine a voltage signal based on a resistive divider in a CCVT consistent with embodiments of the present disclosure.

FIG. 4A illustrates a simplified diagram of a system 400 to determine a voltage signal based on a resistive divider 404 in a CCVT consistent with embodiments of the present disclosure. Resistive divider 404 may be electrically coupled between a first capacitor 402 and a second capacitor 403. The resistive divider may comprise a first resister $R_1$ and a second resistor $R_2$. The voltage between $R_1$ and $R_2$ is proportional to the voltage at node 403, $V_{in}$, and the values of $R_1$ and $R_2$, as set forth in Eq. 12.

$$V_{out} = \frac{R_2}{R_1 + R_{2_1}} V_{in} \qquad \text{Eq. 4}$$

The output voltage, $V_{out}$, of resistive divider 402 may be provided to an IED 406, which may analyze the output voltage and generate a high-fidelity voltage signal that may be used in connection with various embodiments consistent with the present disclosure. In one specific embodiment, the voltage signal from resistive divider 402 may be used in connection with Eq. 2 to separate incident and reflected traveling waves.

Figure 4B:
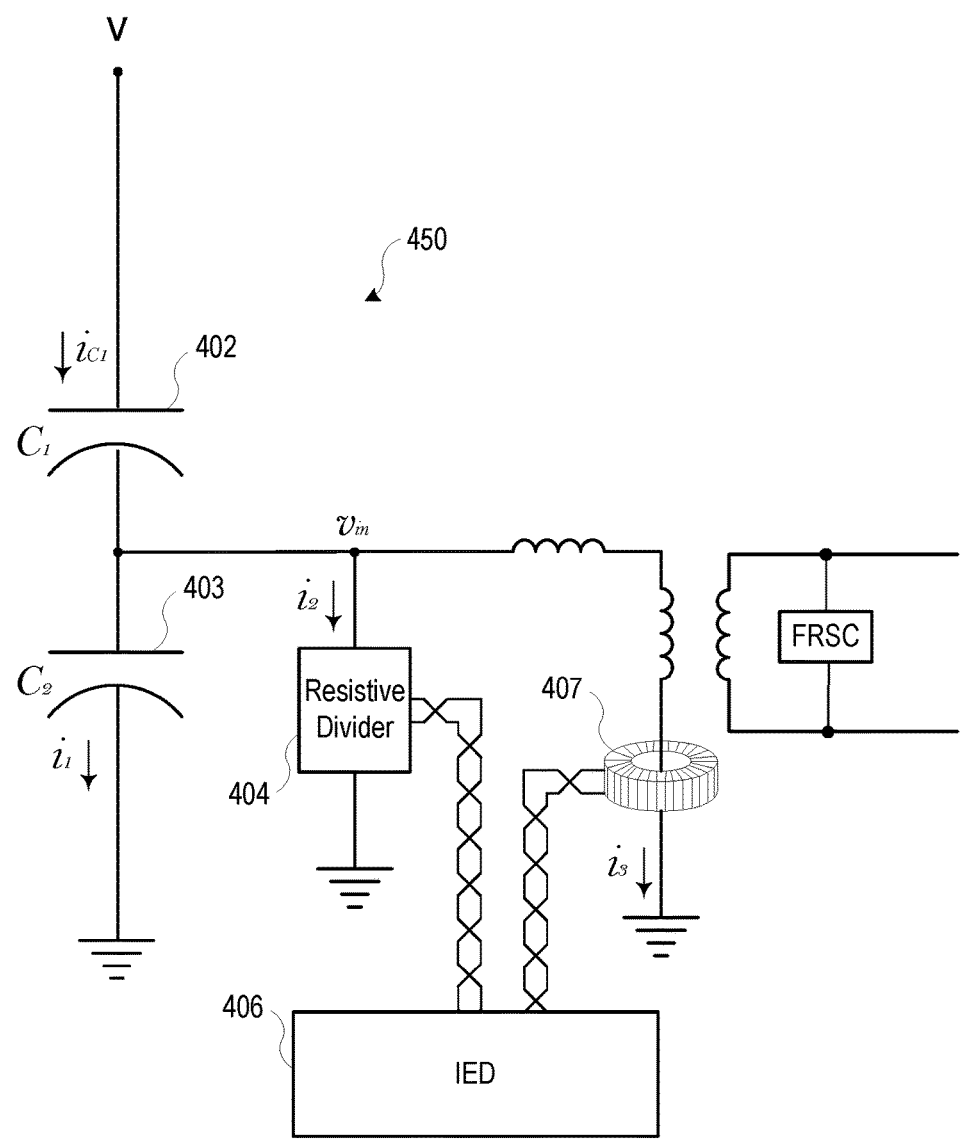
FIG. 4B illustrates a simplified diagram of a system to determine a voltage signal based on a resistive divider and a current measurement device consistent with embodiments of the present disclosure.

Voltage at the node 403 has small error at low frequencies since some of the current passing through the capacitor 403 gets diverted into the tuning reactor FIG. 4B illustrates a simplified diagram of a system 450 to determine a voltage signal based on a resistive divider and a current measurement device 407 consistent with embodiments of the present disclosure. The measurement of current $I_3$ may be advantageous, since the voltage $v_{in}$ measured at the node 403 has small error at low frequencies, caused by the fact that current $i_3$ bypasses the capacitor 403. The measurement of current $I_3$ may also be provided to IED 406 and may be used to generate a high-fidelity voltage signal for use in connection with various embodiments consistent with the present disclosure. In various embodiments, resistive divider 404 and current transformer 407 may provide an improved low frequency response flatness, which may increase waveform fidelity; however, the resistive divider 404 may be adequate for a variety of applications without current transformer 407.

Using Kirchoff's current law, the currents through system 450 may be expressed as a function of the current through capacitor 402, as shown in Eq. 5.

$$i_{C1} = i_1 + i_2 + i_3 \qquad \text{Eq. 5}$$

Current $i_3$ is measured by current transformer 407, and current $i_2$ may be determined based on Ohm's law based on the voltage and the resistance of resistive divider 404. Knowing the voltage $V_{in}$ at the node 403 and the value of the capacitor 403 current $i_1$ may be determined using Eq. 6.

$$i_1 = C_2 \frac{dv_{in}}{dt} \qquad \text{Eq. 6}$$

Having the currents in capacitors 402 and 403, the voltage may be calculated using Eq. 7.

$$v = \frac{1}{C_1} \int i_{C1} dt + V_{in} \qquad \text{Eq. 7}$$

Eq. 7 provides an accurate representation of the voltage in a wide frequency range.

Figure 5:
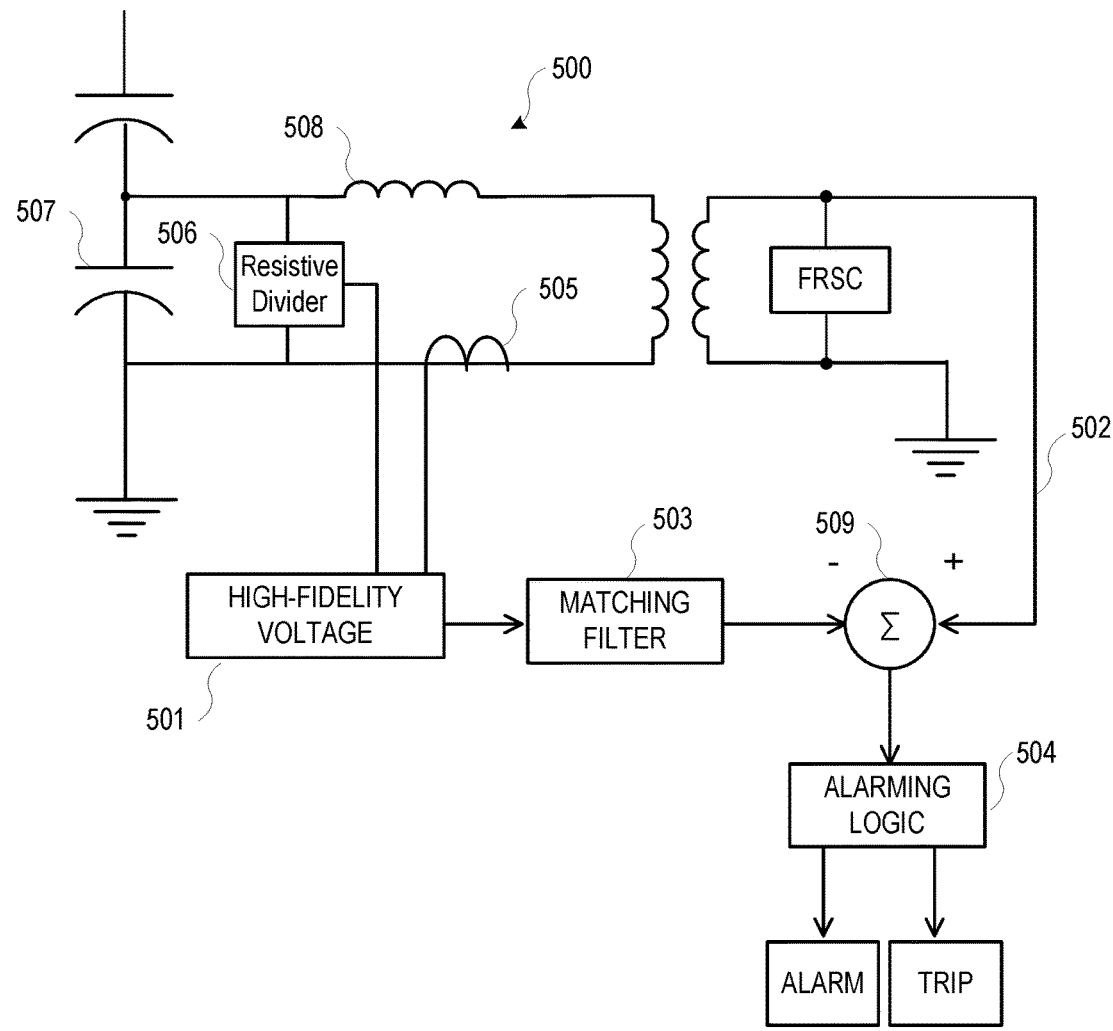
FIG. 5 illustrates a functional block diagram of a system to utilize a high-fidelity voltage signal in a system for issuing an alarm and/or a control action consistent with embodiments of the present disclosure.

FIG. 5 illustrates a functional block diagram of a system 500 to utilize a high-fidelity voltage signal in a system for issuing an alarm and/or a control action consistent with embodiments of the present disclosure. A resistive divider 506 and a current transformer 506 may be used in combination to generate a high-fidelity voltage signal 501.

System 500 compares the high-fidelity voltage 501 with the secondary voltage output of the CCVT 502. The comparison may be filtered to match the frequency response of a normally-functioning CCVT using a matching filter 503. Differences between the two signals may indicate a problem within the CCVT or with the measurements and may trigger an alarm and/or a control action, such as issuing a trip command to the appropriate breaker or breakers to de-energize the CCVT. For example, if capacitor 507 changes its value by 1%, the CCVT secondary voltage 502 will also change by approximately 1%. In addition, the change in the capacitance may also cause a phase shift between the primary and secondary voltage. The phase shift may result from a mismatch with the tuning reactor 508 due to the capacitance changes associated with a potential failure of the CCVT. Various embodiments may utilize nominal values of capacitor 507. Actual changes in capacitance values may change the output in an amount proportional to the change in the current through capacitor 507, which is likely to differ from the actual change in the capacitance value. As a result of this difference, signals received by summer 509 will not match, thus allowing system 500 to detect possible failures.

The alarming logic 504 may operate based on several different principles. For example, it may measure the fundamental frequency component of output of summer 509 and compare its magnitude with a threshold. In some embodiments, alarming logic 504 may apply a time delay before issuing the alarm. In still other embodiments, alarming logic 504 may use a lower threshold to alarm and a higher threshold to issue a trip command. In still other embodiments, alarming logic 504 may integrate the difference and respond with the alarm if the integral is small and with a trip command if the integral is large.

Figure 6:
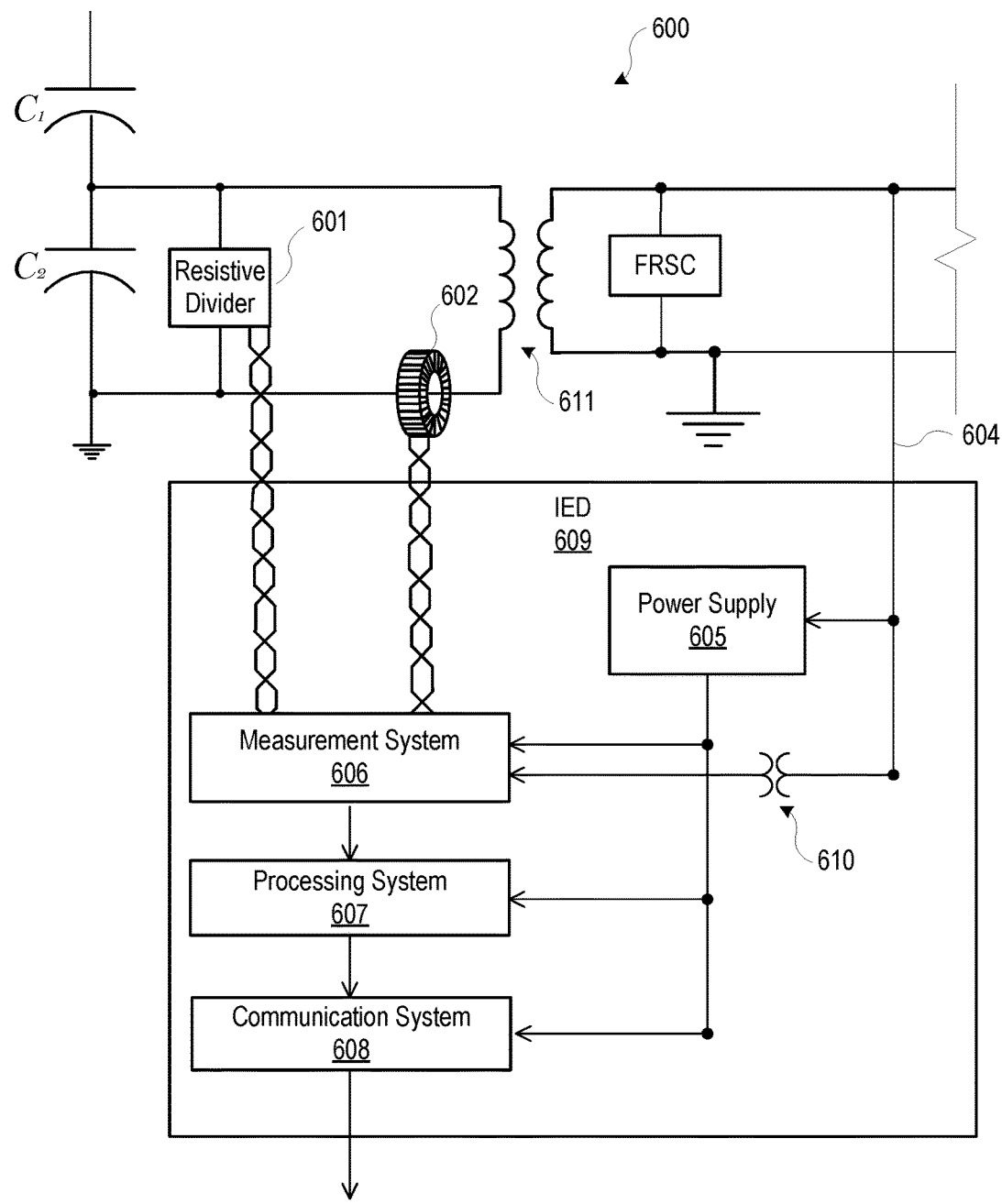
FIG. 6 illustrates a block diagram of a system to monitor a CCVT consistent with the present disclosure.

FIG. 6 illustrates a block diagram of a system 600 to monitor a CCVT consistent with the present disclosure. A resistive divider 601 and a current transformer 602 are in electrical communication with the CCVT and the CCVT secondary voltage 604. Current transformers typically do not generate large signals, and accordingly, the length of their leads connecting to the device implementing the present invention may be limited. As a result, the IED 609 may be installed in a proximity to the CCVT. In one embodiment, the IED 609 may be installed in the substation switchyard.

In the illustrated embodiment, power for an IED 609 is drawn from the secondary voltage output of the CCVT 604. In alternative embodiments, power may be provided by other sources. As illustrated, a power supply 605 may provide power to other components in system 600. Power supply 605 may be designed to accept CCVT output voltage without introducing any consequential distortions to this voltage, and therefore not impacting accuracy of other end devices in system 600 or other devices connected to the same voltage 604. The connection from the secondary CCVT output to the device may be fused, but the fuse is not shown in in the interest of simplicity. A typical CCVT is rated for a burden of upwards of 100 W. The actual burden created by IED609 may be much lower and therefore a CCVT can provide several Watts of power to power the device in system 600. In some embodiments, secondary voltage from all three power system phases may be used to power the device, thus distributing the load.

In the illustrated embodiment a potential transformer 610 provides a measurement of the voltage associated with the secondary output from a step-down transformer 611. Using the voltage measurement of the secondary output from the step-down transformer 611 during a steady state period, system 600 may determine the values of $C_1$ and $C_2$ and the potential transformer ratio N, which may be used in connection with various equations, including Eq. 3, Eq. 4, Eq. 5 and Eq. 7.

The secondary voltage 604 is provided to the measurement system in addition to signals from resistive divider 601 and current transformer 602. In some embodiments, an alarm subsystem may be included within the measurement system 606. Measurement system 606 may include an ADC to create digitized representations of the signals from resistive divider 601 and current transformer 602.

The measurements are provided to a processing system 607. Processing system 607 may analyze the measurements and generate alarms and or control actions. The processing system 607 may transmit the high-fidelity voltage, the secondary voltage, the alarm signal, and the trip signal using a communication system 608. Communication system 608 may communicate using a variety of communication media and protocols. In some embodiments, communication system 608 provide a representation of the high-fidelity full-scale voltage signal as an output. Still further, communication system 608 may provide a representation of the voltage derivative directly as a representation of a voltage traveling waves. In some embodiments, communication system 608 may communicate via a fiber optic medium. Other forms of communication media may also be used.

Systems and methods consistent with the present disclosure may generate high-fidelity voltage signals in the frequency spectrum of up to several hundreds of kHz. Therefore, the sampling rate for digitizing the signals of interest and providing them to the devices consuming the information, may be in the range of 1 MHz or higher.

Figure 7:
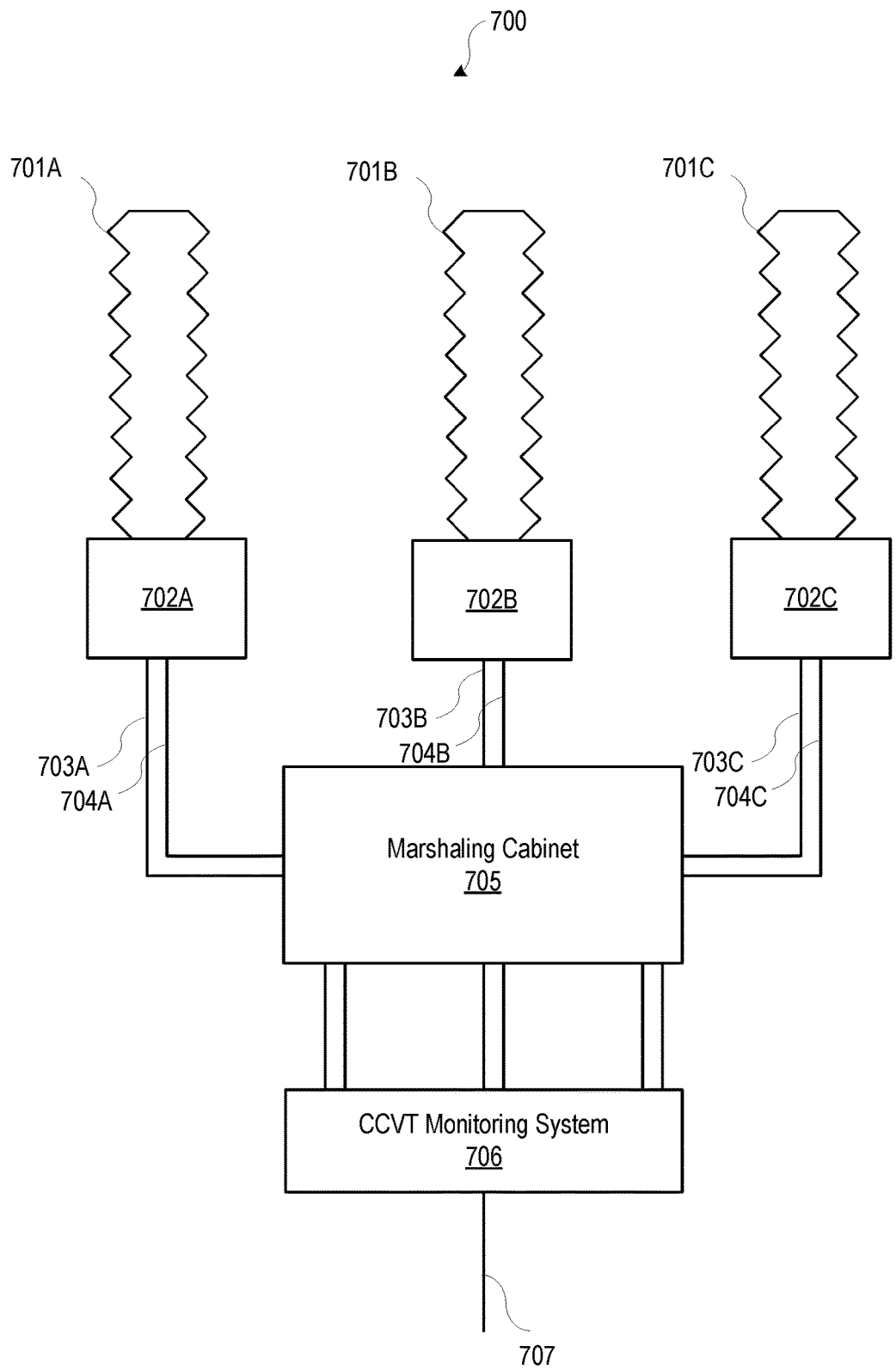
FIG. 7 illustrates a simplified diagram of a three-phase CCVT system consistent with embodiments consistent with the present disclosure.

FIG. 7 illustrates a representation of the placement of a system consistent with respect to a CCVT consistent with embodiments of the present disclosure. A CCVT monitoring system 706 consistent with the present disclosure may be disposed in a substation switchyard in proximity to the marshaling cabinet 705. The signals of interest may be provided to other devices, via a communication channel 707. In some embodiments, the other devices may be located in the control house. The communication channel 707 may be embodied as a fiber optic connection or other type of communication media.

The marshaling cabinet 705 is typically a part of a practical CCVT installation. It allows a cross-connection and demarcation point between the voltage control cables that run toward the control house and the single-phase CCVTs 701A, 701B, and 701C in the switchyard. These CCVTs serve the A, B, and C phases of the three-phase power system, and may have their own cabinets 702A, 702B, and 702C at the bottom. A CCVT monitoring system consistent with the present disclosure may place the current transformers inside the 702A, 702B, and 702C cabinets and may be connected via shielded twisted-pair cables 703A, 703B, and 703C to the marshaling cabinet 705, using a similar path and conduits—if possible—as the secondary voltage cables. The secondary voltages may be connected to the marshaling cabinet 705 with the single-phase voltage cables 704A, 704B, and 704C. The CCVT monitoring system 706 may be placed inside the marshaling cabinet 705 if space permits, or in its own cabinet mounted in proximity to the marshaling cabinet 705.

Figure 8:
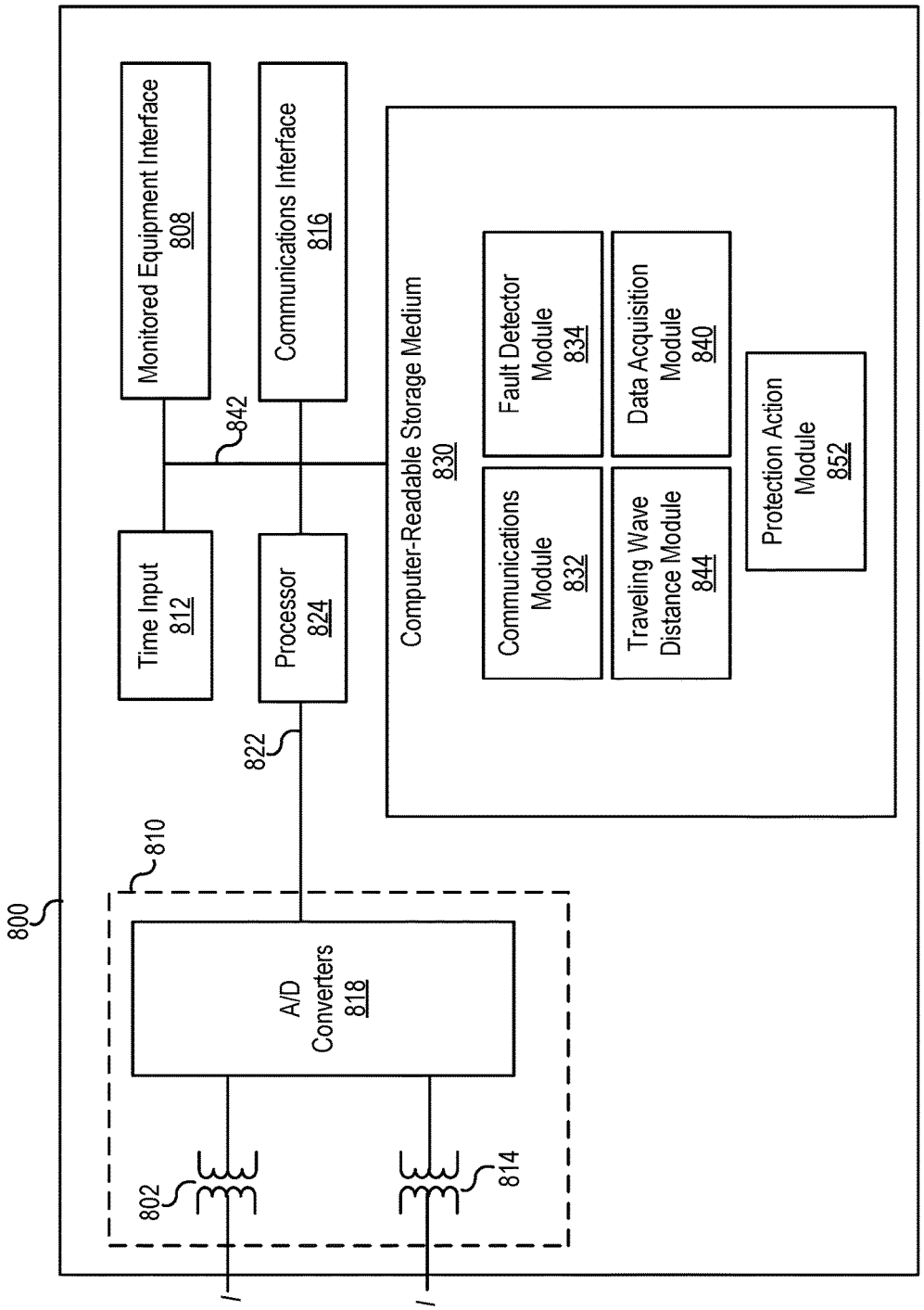
FIG. 8 illustrates a functional block diagram of a system for detecting and locating faults using traveling waves consistent with embodiments of the present disclosure.

FIG. 8 illustrates a functional block diagram of a system 800 for detecting and locating faults using traveling waves consistent with embodiments of the present disclosure. System 800 includes a communications interface 816 to communicate with devices and/or IEDs. In certain embodiments, the communications interface 816 may facilitate direct communication with other IEDs or communicate with systems over a communications network. Consistent with the embodiments of this disclosure the interface 816 may include communications with the CCVT high-fidelity voltage IED with the intent to receive the high-fidelity voltage, the secondary CCVT voltage, voltage TWs, CCVT alarm and trip signals, or a combination of the above. Also, the interface 816 may provide the said CCVT information to other devices. Communications interface 816 may facilitate communications through a network. System 800 may further include a time input 812, which may be used to receive a time signal (e.g., a common time reference) allowing system 800 to apply a time-stamp to the acquired samples. In certain embodiments, a common time reference may be received via communications interface 816, and accordingly, a separate time input may not be required for time-stamping and/or synchronization operations. One such embodiment may employ the IEEE 1588 protocol. A monitored equipment interface 808 may receive status information from, and issue control instructions to, a piece of monitored equipment, such as a circuit breaker, conductor, transformer, or the like.

Processor 824 may process communications received via communications interface 816, time input 812, and/or monitored equipment interface 808. Processor 824 may operate using any number of processing rates and architectures. Processor 824 may perform various algorithms and calculations described herein. Processor 824 may be embodied as a general-purpose integrated circuit, an application-specific integrated circuit, a field-programmable gate array, and/or any other suitable programmable logic device.

In certain embodiments, system 800 may include a sensor component 810. In the illustrated embodiment, sensor component 810 gathers data directly from conventional electric power system equipment such as a conductor (not shown) using potential transformers and/or current transformers. In various embodiments, sensor component 810 may be in electrical communication with a clamp-on CT in a CCVT as described in connection with various embodiments of the present disclosure. The sensor component 810 may use, for example, transformers 802 and 814 and A/D converters 818 that may sample and/or digitize filtered waveforms to form corresponding digitized current and voltage signals provided to data bus 822. A/D converters 818 may include a single ND converter or separate A/D converters for each incoming signal. A current signal may include separate current signals from each phase of a three-phase electric power system. A single line diagram is shown only for the sake of clarity.

A/D converters 818 may be connected to processor 824 by way of data bus 822, through which digitized representations of current and voltage signals may be transmitted to processor 824. In various embodiments, the digitized current and voltage signals may be used to calculate time-domain quantities for the detection and the location of a fault on an electric power system as described herein.

A computer-readable storage medium 830 may be the repository of various software modules to perform any of the methods described herein. A data bus 842 may link monitored equipment interface 808, time input 812, communications interface 816, and computer-readable storage medium 830 to processor 824.

Communications module 832 may allow system 800 to communicate with any of a variety of external devices via communications interface 816. Communications module 832 may be configured for communication using a variety of data communication protocols (e.g., UDP over Ethernet, IEC 61850, etc.).

Data acquisition module 840 may collect data samples such as the current and voltage quantities and the incremental quantities. The data samples may be associated with a timestamp and made available for retrieval and/or transmission to a remote IED via communications interface 816. Traveling waves may be measured and recorded in real-time, since they are transient signals that dissipate rapidly in an electric power delivery system. Data acquisition module 840 may operate in conjunction with fault detector module 834. Data acquisition module 840 may control recording of data used by the fault detector module 834. According to one embodiment, data acquisition module 840 may selectively store and retrieve data and may make the data available for further processing. Such processing may include processing by fault detector module 834, which may determine the occurrence of a fault with an electric power distribution system.

Traveling wave distance module 844 may detect a fault on the electric power delivery system within a zone of protection. In various embodiments, the systems and methods disclosed in each of the following applications may be used to determine whether a fault occurs within a zone of protection:

application Ser. No. 16/137,343, filed on Sep. 20, 2018, and are titled DISTANCE PROTECTION USING TRAVELING WAVES IN AN ELECTRIC POWER DELIVERY SYSTEM;
  application Ser. No. 16/137,350, filed on Sep. 20, 2018, and are titled SECURE TRAVELING WAVE DISTANCE PROTECTION IN AN ELECTRIC POWER DELIVERY SYSTEM; and
  application Ser. No. 16/137,330, filed on Sep. 20, 2018, and are titled TRAVELING WAVE IDENTIFICATION USING DISTORTIONS FOR ELECTRIC POWER SYSTEM PROTECTION.

Each application is incorporated herein by reference.

The traveling wave distance module 844 may use the high-fidelity voltage signals obtained using the systems and methods described herein to determine occurrence of a traveling wave, and time stamp occurrences of a traveling wave. The time stamps may be used to determine a time of occurrence of the fault and a time of the arrival of the traveling wave from the fault to the CCVT. The traveling wave distance module 844 may compare the time difference between the time of the fault and the time of arrival of the traveling wave against a predetermined reach setting in order to instigate a traveling wave distance signal TW21. The traveling wave distance signal TW21 may be used by other modules, such as the protection action module 852, fault detector module 834, and the like. In some embodiments, traveling wave distance module 844 may analyze the dispersion associated with ground and aerial modes of a traveling wave to estimate a distance to fault.

A protective action module 852 may implement a protective action based on the declaration of a fault by the fault detector module 834. In various embodiments, a protective action may include tripping a breaker, selectively isolating a portion of the electric power system, etc. In various embodiments, the protective action module 852 may coordinate protective actions with other devices in communication with system 800. In various embodiments, system 800 may provide protection based on instantaneous voltages and currents. Such signal components require shorter data windows but facilitate faster protection. Various embodiments of system 800 may achieve an operating time of approximately 1 millisecond.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to detect a fault in an electric power delivery system, comprising:
    a capacitance-coupled voltage transformer (CCVT) in electrical communication with the electric power delivery system, the CCVT comprising:
        a first capacitor electrically disposed between a high-voltage electrical bus and a first electrical node;
        a second capacitor electrically disposed between the first electrical node and a ground connection;
    a resistive divider in electrical communication with the first electrical node, the resistive divider to generate a resistive divider electrical signal corresponding to a voltage value at the first node;
    an intelligent electronic device (IED) in electrical communication with the resistive divider to:
        receive a measurement of a primary current through an electrical bus in electrical communication with the CCVT;
        generate a resistive divider voltage signal based on the resistive divider electrical signal;
        identify an incident traveling wave and a reflected traveling wave based on the resistive divider voltage signal and the measurement of the primary current;
        detect a fault based on the incident traveling wave and the reflected traveling wave; and
    a protective action module to implement a protective action based on detection of the fault.

2. The system of claim 1, wherein the resistive divider voltage signal comprises a frequency range from 5 Hz to 500 kHz.

3. The system of claim 1, further comprising:
    a tuning reactor electrically connected to the first electrical node;
    a tuning reactor current measurement device disposed between the tuning reactor and the ground connection, the tuning reactor current measurement device to provide a tuning reactor signal corresponding to a current flowing through the tuning reactor;
    wherein the IED further:
        receives the tuning reactor signal; and
        identifies the incident traveling wave and the reflected traveling wave based on the resistive divider voltage signal, the tuning reactor signal, and the measurement of the primary current.

4. The system of claim 3, wherein the resistive divider voltage signal and the tuning reactor signal comprise a frequency range from 5 Hz to 500 kHz.

5. The system of claim 1, further comprising:
    a tuning reactor electrically connected to the first electrical node;
    a step-down transformer comprising a primary winding electrically connected to the tuning reactor.
    a secondary winding in electromagnetic communication with the primary winding;
    a secondary winding voltage measurement device to generate a secondary winding voltage signal based measured on an output of the secondary winding;
    wherein the IED determines a capacitance value of the stack of capacitors based on the secondary winding voltage signal measured during a first steady state period of operation.

6. The system of claim 5, wherein the IED determines a change in the capacitance value, based on a change in the secondary winding voltage signal voltage signal during a second steady state period of operation; and
    the protective action module generates an alarm based on the change in the capacitance value of the stack of capacitors.

7. The system of claim 6, wherein the IED further implements a second protective action upon detection of the change in the capacitance value of the stack of capacitors.

8. The system of claim 1, further comprising a primary current measurement device in communication with the IED and coupled to the electrical bus.

9. The system of claim 1, wherein the protective action comprises generation of a signal to actuate the circuit breaker upon detection of the fault.

10. The system of claim 1, where in the resistive divider comprises:
    a first resistor coupled to the first electrical node and a voltage output; and
    a second resistor coupled to the voltage output and the ground connection.

11. The system of claim 1, further comprising a communication system to communicate a representation of the resistive divider voltage signal to a network in communication with other devices associated with the electric power delivery system.

12. A system to detect a fault in an electric power delivery system, comprising:
    a capacitance-coupled voltage transformer (CCVT) in electrical communication with the electric power delivery system, the CCVT comprising:
        a first capacitor electrically coupled between a high-voltage electrical bus and a first electrical node;
        a second capacitor electrically coupled between the first electrical node and a ground connection;
    a tuning reactor coupled to the first electrical node
    a resistive divider in electrical communication with the first electrical node, the resistive divider to generate a resistive divider electrical signal corresponding to a voltage value at the first node;
    a tuning reactor current measurement device disposed between the primary winding and the ground connection, the tuning reactor current measurement device to provide a tuning reactor signal corresponding to a tuning reactor current flow through the tuning reactor;

a processing system to:
receive a measurement of a primary current through the high-voltage electrical bus;
generate a high-fidelity voltage signal based on the resistive divider electrical signal and the tuning reactor signal;
identify an incident traveling wave and a reflected traveling wave based on the high-fidelity voltage signal and the measurement of the primary current;
detect a fault based on the incident traveling wave and the reflected traveling wave; and a protective action module to implement a protective action based on detection of the fault.

13. The system of claim 12, wherein the high-fidelity voltage signals comprise a frequency range from 5 Hz to 500 kHz.

14. The system of claim 12, where in the resistive divider comprises:
a first resistor coupled to the first electrical node and a voltage output; and
a second resistor coupled to the voltage output and the ground connection.

15. The system of claim 12, further comprising:
a step-down transformer comprising a primary winding electrically connected to the tuning reactor.
a secondary winding in electromagnetic communication with the primary winding;
a secondary winding voltage measurement device to generate a secondary winding voltage signal based measured on an output of the secondary winding;
wherein the IED determines a capacitance value of the stack of capacitors based on the secondary winding voltage signal measured during a first steady state period of operation.

16. The system of claim 15, wherein the IED determines a change in the capacitance value, based on a change in the secondary winding voltage signal voltage signal during a second steady state period of operation; and
the protective action module generates an alarm based on the change in the capacitance value of the stack of capacitors.

17. The system of claim 12, further comprising a primary current measurement device in communication with the IED and coupled to the electrical bus.

18. A method of detecting a fault in an electric power delivery system, comprising:
providing a capacitance-coupled voltage transformer (CCVT) in electrical communication with the electric power delivery system, the CCVT comprising a first capacitor electrically disposed between a high-voltage electrical bus and a first electrical node and a second capacitor electrically disposed between the first electrical node and a ground connection;
receive a measurement of a primary current through an electrical bus in electrical communication with the CCVT;
receiving, from a resistive divider in electrical communication with a first node, a resistive divider signal corresponding to a voltage value at the first node;
generating a resistive divider voltage signal based on the resistive divider signal;
identifying an incident traveling wave and a reflected traveling wave based on the resistive divider voltage signal and the measurement of the primary current;
detecting a fault based on the incident traveling wave and the reflected traveling wave; and
implementing a protective action based on detection of the fault.

19. The method of claim 18, further comprising:
providing a tuning reactor electrically connected to the first electrical node;
providing a step-down transformer comprising a primary winding, the primary winding electrically connected to the tuning reactor;
receiving, from a tuning reactor current measurement device disposed between the tuning reactor and the ground connection, a tuning reactor signal corresponding to a current flowing through the tuning reactor;
receiving the tuning reactor signal;
identifying the incident traveling wave and the reflected traveling wave based on the resistive divider voltage signal, the tuning reactor voltage signal and the measurement of the primary current.

20. The method of claim 18, further comprising:
providing a secondary winding in electromagnetic communication with the primary winding;
receiving, from a secondary winding voltage measurement device, a secondary winding voltage signal based measured on an output of the secondary winding;
determining a capacitance value of the stack of capacitors based on the secondary winding voltage signal measured during a first steady state period of operation;
determining a change in the capacitance value, based on a change in the secondary winding voltage signal voltage signal during a second steady state period of operation; and
generating an alarm based on the change in the capacitance value of the stack of capacitors.

* * * * *